United States Patent
Singh et al.

(10) Patent No.: US 7,932,181 B2
(45) Date of Patent: Apr. 26, 2011

(54) EDGE GAS INJECTION FOR CRITICAL DIMENSION UNIFORMITY IMPROVEMENT

(75) Inventors: Harmeet Singh, Fremont, CA (US); David Cooperberg, Mount Kisco, NY (US); Vahid Vahedi, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 712 days.

(21) Appl. No.: 11/455,671

(22) Filed: Jun. 20, 2006

(65) Prior Publication Data

US 2007/0293043 A1    Dec. 20, 2007

(51) Int. Cl.
*C23F 1/00* (2006.01)
*B44C 1/22* (2006.01)
*H01L 21/302* (2006.01)

(52) U.S. Cl. ............................. 438/689; 216/67; 216/68

(58) Field of Classification Search .................. 438/689; 216/67, 68
See application file for complete search history.

(56) References Cited

U.S. PATENT DOCUMENTS

| | | | |
|---|---|---|---|
| 4,275,752 A | 6/1981 | Collier et al. |
| 4,369,031 A | 1/1983 | Goldman et al. |
| 4,835,114 A | 5/1989 | Satou et al. |
| 5,077,875 A | 1/1992 | Hoke et al. |
| 5,100,505 A | 3/1992 | Cathey, Jr. |
| 5,200,388 A | 4/1993 | Abe et al. |
| 5,288,325 A | 2/1994 | Gomi |
| 5,310,426 A | 5/1994 | Mori |
| 5,313,982 A | 5/1994 | Ohmi et al. |
| 5,460,654 A | 10/1995 | Kikkawa et al. |
| 5,589,110 A | 12/1996 | Motoda et al. |
| 5,620,524 A | 4/1997 | Fan et al. |
| 5,651,825 A | 7/1997 | Nakahigashi et al. |
| 5,865,205 A | 2/1999 | Wilmer |
| 5,950,693 A | 9/1999 | Noah et al. |
| 6,039,074 A | 3/2000 | Raaijmakers et al. |
| 6,052,176 A | 4/2000 | Ni et al. |
| 6,058,958 A | 5/2000 | Benkowski et al. |
| 6,090,210 A | 7/2000 | Ballance et al. |
| 6,119,710 A | 9/2000 | Brown |
| 6,132,515 A | 10/2000 | Gauthier |
| 6,155,289 A | 12/2000 | Carlsen et al. |
| 6,192,919 B1 | 2/2001 | Jackson et al. |
| 6,224,681 B1 | 5/2001 | Sivaramakrishnan et al. |

(Continued)

OTHER PUBLICATIONS

Braun. 300 mm Overcomes Critical Hurdles. Semiconductor International (online) Jun. 1, 2001 http:www.semiconductor.net/article/CA170475.html, accessed Oct. 2, 2007.

(Continued)

*Primary Examiner* — Binh X Tran
*Assistant Examiner* — Mahmoud Dahimene
(74) *Attorney, Agent, or Firm* — Buchanan Ingersoll & Rooney PC

(57) ABSTRACT

A method of etching a semiconductor substrate with improved critical dimension uniformity comprises supporting a semiconductor substrate on a substrate support in an inductively coupled plasma etch chamber; supplying a first etch gas to a central region over the semiconductor substrate; supplying a second gas comprising at least one silicon containing gas to a peripheral region over the semiconductor substrate surrounding the central region, wherein a concentration of silicon in the second gas is greater than a concentration of silicon in the first etch gas; generating plasma from the first etch gas and second gas; and plasma etching an exposed surface of the semiconductor substrate.

19 Claims, 3 Drawing Sheets

U.S. PATENT DOCUMENTS

Figure 2:
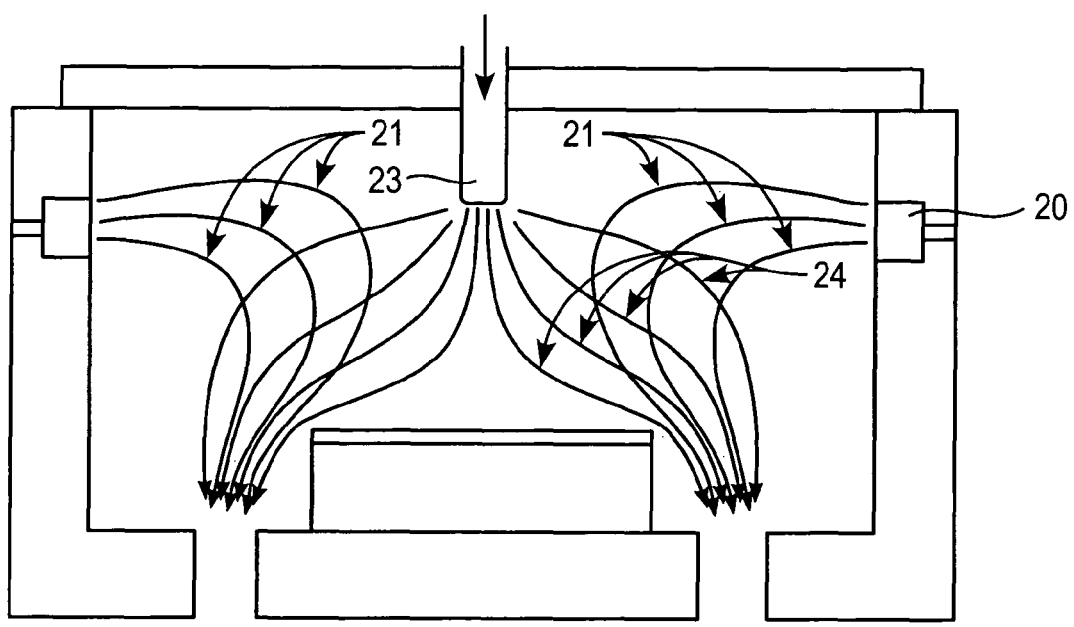

| | | | |
|---|---|---|---|
| 6,245,192 B1 | 6/2001 | Dhindsa et al. | |
| 6,251,792 B1 | 6/2001 | Collins et al. | |
| 6,253,783 B1 | 7/2001 | Carlsen et al. | |
| 6,296,711 B1 | 10/2001 | Loan et al. | |
| 6,302,139 B1 | 10/2001 | Dietz | |
| 6,315,858 B1 | 11/2001 | Shinozuka et al. | |
| 6,415,736 B1 | 7/2002 | Hao et al. | |
| 6,432,831 B2 | 8/2002 | Dhindsa et al. | |
| 6,457,494 B1 | 10/2002 | Gregg et al. | |
| 6,534,416 B1 | 3/2003 | Ye et al. | |
| 6,593,245 B1 | 7/2003 | Chan | |
| 6,864,174 B2 | 3/2005 | Lin et al. | |
| 6,893,975 B1 | 5/2005 | Yue et al. | |
| 6,972,258 B2 | 12/2005 | Chu et al. | |
| 7,166,536 B1 * | 1/2007 | Laermer et al. | 438/719 |
| 7,250,373 B2 * | 7/2007 | Mui et al. | 438/714 |
| 2001/0044212 A1 | 11/2001 | Nguyen et al. | |
| 2001/0047760 A1 | 12/2001 | Moslehi | |
| 2001/0051439 A1 * | 12/2001 | Khan et al. | 438/710 |
| 2002/0014207 A1 | 2/2002 | Sivaramakrishnan et al. | |
| 2002/0100416 A1 | 8/2002 | Sun et al. | |
| 2002/0108570 A1 | 8/2002 | Lindfors | |
| 2002/0108933 A1 | 8/2002 | Hoffman et al. | |
| 2002/0144657 A1 | 10/2002 | Chiang et al. | |
| 2002/0160125 A1 | 10/2002 | Johnson et al. | |
| 2002/0170598 A1 | 11/2002 | Girard et al. | |
| 2002/0192369 A1 | 12/2002 | Morimoto et al. | |
| 2003/0003696 A1 | 1/2003 | Gelatos et al. | |
| 2003/0019580 A1 | 1/2003 | Strang | |
| 2003/0045114 A1 | 3/2003 | Ni et al. | |
| 2003/0045131 A1 * | 3/2003 | Verbeke et al. | 438/795 |
| 2003/0070620 A1 | 4/2003 | Cooperberg et al. | |
| 2003/0094903 A1 | 5/2003 | Tao et al. | |
| 2003/0136332 A1 * | 7/2003 | Krishnaraj et al. | 117/92 |
| 2003/0186545 A1 | 10/2003 | Kamp et al. | |
| 2003/0218427 A1 | 11/2003 | Hoffman et al. | |
| 2004/0018741 A1 | 1/2004 | Deshmukh et al. | |
| 2004/0038540 A1 | 2/2004 | Li et al. | |
| 2004/0056602 A1 | 3/2004 | Yang et al. | |
| 2004/0079728 A1 * | 4/2004 | Mungekar et al. | 216/67 |
| 2004/0084406 A1 | 5/2004 | Kamp et al. | |
| 2004/0112539 A1 | 6/2004 | Larson et al. | |
| 2004/0112540 A1 | 6/2004 | Larson et al. | |
| 2004/0118344 A1 | 6/2004 | Ni et al. | |
| 2004/0129211 A1 | 7/2004 | Blonigan et al. | |
| 2004/0175950 A1 * | 9/2004 | Puppo et al. | 438/691 |
| 2005/0006346 A1 | 1/2005 | Annapragada et al. | |
| 2005/0009324 A1 | 1/2005 | Li et al. | |
| 2005/0079704 A1 | 4/2005 | Zhu et al. | |
| 2005/0079710 A1 | 4/2005 | Zhu et al. | |
| 2005/0079725 A1 | 4/2005 | Zhu et al. | |
| 2005/0101135 A1 | 5/2005 | Annapragada et al. | |
| 2005/0241763 A1 | 11/2005 | Huang et al. | |
| 2006/0000802 A1 | 1/2006 | Kumar et al. | |
| 2006/0099816 A1 | 5/2006 | Dalton et al. | |

OTHER PUBLICATIONS

International Search Report for International Application No. PCT/US07/13159, International Filing Date: Jun. 5, 2007 dated Nov. 30, 2007.

Written Opinion of the International Searching Authority for International Application No. PCT/US07/13159, International Filing Date: Jun. 5, 2007 dated Nov. 30, 2007.

Official Action mailed May 26, 2010 for Chinese Patent Appln. No. 200780023257.7.

International Preliminary Report on Patentability dated Dec. 22, 2008 for PCT/US2007/013159.

* cited by examiner

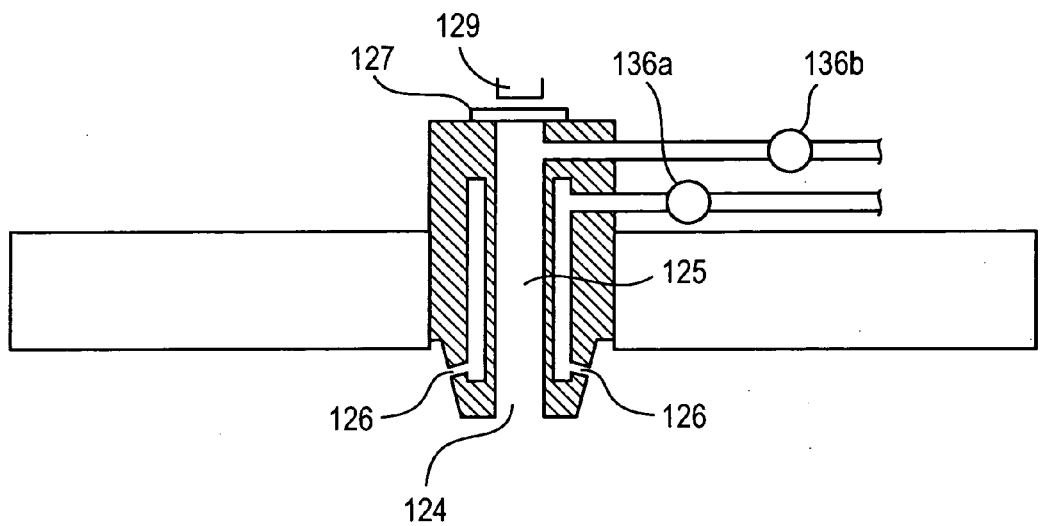
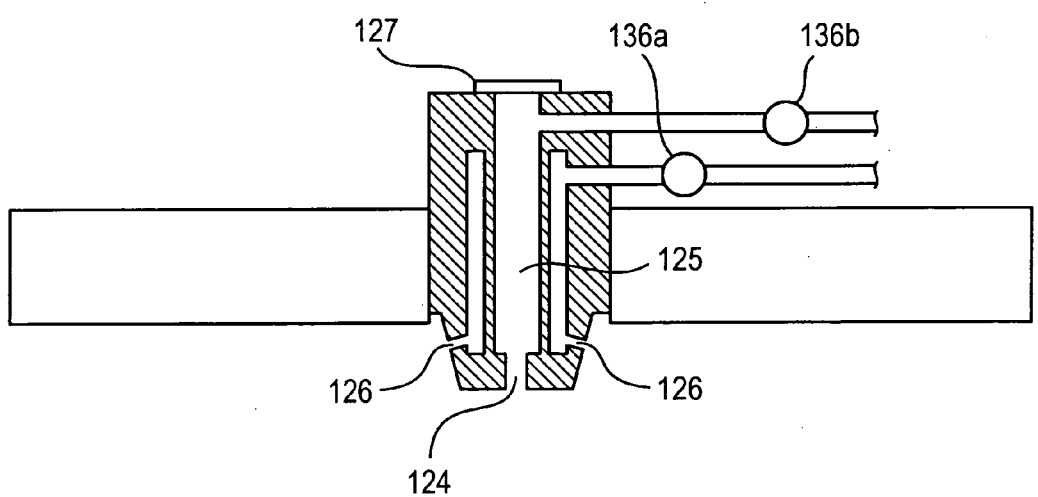

EDGE GAS INJECTION FOR CRITICAL DIMENSION UNIFORMITY IMPROVEMENT

SUMMARY

Provided is a method of etching a semiconductor substrate with improved critical dimension uniformity. The method comprises supporting a semiconductor substrate on a substrate support in a plasma etch chamber; supplying a first etch gas to a central region over the semiconductor substrate; supplying a second gas comprising at least one silicon containing gas to a peripheral region over the semiconductor substrate surrounding the central region, wherein a concentration of silicon in the second gas is greater than a concentration of silicon in the first etch gas; generating plasma from the first etch gas and second gas; and plasma etching an exposed surface of the semiconductor substrate.

BRIEF DESCRIPTION OF THE DRAWING FIGURES

Figure 3:
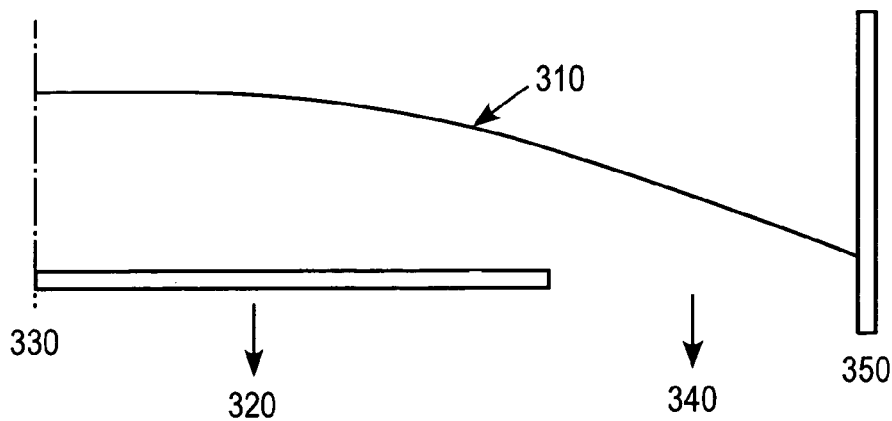
Figure 4:
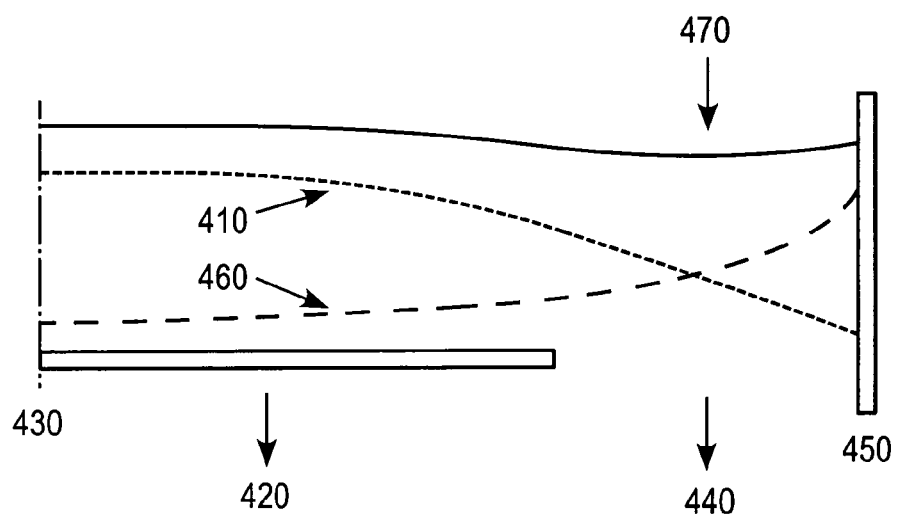

FIGS. 1a-b show details of a two-zone injector;

FIG. 2 shows an embodiment of a plasma chamber useful for edge gas injection;

FIG. 3 is a schematic showing a radial concentration profile of $SiCl_x$ in a plasma etch chamber, wherein a silicon layer on a semiconductor substrate is etched with plasma formed from $Cl_2$; and FIG. 4 is a schematic showing a radial concentration profile of $SiCl_x$ in a plasma etch chamber, wherein a silicon layer on a semiconductor substrate is etched with plasma formed from $Cl_2$ and silicon containing gas is supplied to a peripheral region over the semiconductor substrate.

DETAILED DESCRIPTION OF PREFERRED EMBODIMENTS

During the manufacture of semiconductor-based products such as integrated circuits, etching and/or deposition steps may be used to build up or remove layers of material on a semiconductor substrate such as a wafer. A conventional etching procedure involves the use of one or more etch gases energized into a plasma state to effect plasma etching of a layer of material. Features to be etched include, for example, openings, vias, trenches, and gate structures.

Many plasma etch applications rely on the generation of a passivation layer to obtain a desired feature profile. The primary mechanism for profile control involves the balance of etch and deposition reactions. The etch reactions are generally directly controlled by the reaction chamber parameters such as input power, pressure, and gas flows. In plasma etching of silicon wafers, etch reaction products are the primary deposition source with the result that deposition mechanisms are indirectly controlled.

The critical dimension (CD) is the dimension of the smallest geometrical feature (for example, width of interconnect line, contacts, trenches, etc.) which can be formed during semiconductor device/circuit manufacturing using given technology. Critical dimension uniformity is provided when the critical dimension of features at the center of a wafer is the same as the critical dimension of features closer to the edge of the wafer. Critical dimension uniformity is highly desirable to a nearly perfect degree, with features etched near the center of a wafer being substantially uniform with equivalent features etched closer to the edge of the wafer, since otherwise the integrated circuits being fabricated will have electronic characteristics that deviate more than is desirable. With each increase in the size of wafer diameter, the problem of ensuring uniformity of integrated circuits formed across larger and larger wafers becomes more difficult.

Various etch gas chemistries are used in etch applications. For example, when using $HBr$—$O_2$ etch gas chemistries, the passivation layer is primarily made up of $Si_xBr_yO_z$. For $Cl_2$—$O_2$ etch gas chemistries, the passivation layer is primarily made of $Si_xCl_yO_z$. Other constituents of the passivation layer can include N, C, H and F. Moreover, as a result of etching of silicon wafers and/or chamber materials such as quartz components, volatile silicon etch byproducts are incorporated in the passivation layer.

Silicon can be incorporated in passivation layers due to etching of silicon sources such as silicon wafers and/or chamber materials. Such silicon sources are secondary products that are not directly controlled by the etch gas chemistry. Moreover, as the volatile silicon etch byproducts are transported from the wafer surface toward the vacuum evacuation port, there is a finite possibility of deposition of the silicon-containing byproducts on the wafer surface. Further, the volatile silicon etch byproducts may be dissociated in the plasma region into reactive agents with larger probabilities of deposition of the silicon-containing byproducts on the wafer surface. Deposition of the silicon-containing byproducts on the wafer surface can lead to non-uniform silicon byproduct concentration across the wafer and lead to non-uniformity of the etched feature critical dimension.

Provided is a method of etching a semiconductor substrate with improved critical dimension uniformity. The method comprises supporting a semiconductor substrate on a substrate support in a plasma etch chamber; supplying a first etch gas to a central region over the semiconductor substrate; supplying a second gas comprising at least one silicon containing gas to a peripheral region over the semiconductor substrate surrounding the central region, wherein a concentration of silicon in the second gas is greater than a concentration of silicon in the first etch gas; generating plasma from the first etch gas and second gas; and plasma etching an exposed surface of the semiconductor substrate. Preferably, features etched near the center of the semiconductor substrate are substantially uniform with equivalent features etched closer to the edge of the semiconductor substrate.

Exemplary silicon containing gases include, for example, $SiCl_4$, $SiHCl_3$, $SiH_2Cl_2$, $SiH_3Cl$, $SiH_4$, $Si_2H_6$, $SiH_3CH_3$, $SiH(CH_3)_3$, $SiF_4$, $SiBr_4$, tetraethyl orthosilicate (TEOS), or mixtures thereof. The second gas, which comprises at least one silicon containing gas, may further include: (1) an inert carrier gas such as, for example, He, Ne, Ar, Kr, Xe, or mixtures thereof; (2) an etchant gas such as, for example, $Cl_2$, $C_xF_y$, HBr, $C_xF_yH_z$ (e.g., $CF$, $CF_2$, $CF_3$, etc.), $SF_6$, HCl, or mixtures thereof, such as, for example, a mixture of $SF_6$ and $CH_2F_2$; and/or (3) a passivation gas such as, for example, $O_2$, $N_2$, or mixtures thereof.

The first etch gas may or may not contain silicon. The method may further comprise adjusting: (1) an amount of second gas supplied to the peripheral region; (2) an amount of silicon supplied to the peripheral region; and/or (3) a ratio of a concentration of silicon in the second gas to a concentration of silicon in the first etch gas.

The exposed surface of the semiconductor substrate may comprise a silicon layer, which can be a portion of a single crystal silicon wafer beneath a mask such as a silicon nitride, silicon oxide, or silicon oxynitride mask layer. Alternatively, the silicon layer can be an epitaxial layer, a strained silicon layer or a silicon-germanium layer on a substrate such as a single crystal silicon wafer. The silicon layer may comprise a layer of polycrystalline silicon on a silicon wafer wherein the polycrystalline silicon layer is between an underlying gate oxide and an overlying hard or soft mask layer such as a silicon nitride, silicon oxide, or silicon oxynitride mask layer or photoresist. Alternatively, the disclosed method of etching is applicable to additional etch applications such as etching of, for example, polycrystalline silicon gates, metal gates, high dielectric constants (K), W and WSi gates, and spacers.

For example, for a 300 mm wafer, the etched features are preferably less than 50 nm (e.g., 45 nm, 25 nm, 18 nm, etc.) and have less than or equal to 1.5 nm 3σ non-uniformity.

The plasma is preferably a high density plasma produced in a transformer coupled plasma (TCP™) reactor available from Lam Research Corporation which is also called inductively coupled plasma (ICP) reactor.

The presently disclosed method is preferably carried out in an inductively coupled plasma reactor maintained at a desired vacuum pressure by a vacuum pump connected to an outlet in a wall of the reactor. Etching gas can be supplied to a showerhead or injector arrangement by supplying gas from a gas supply to a plenum extending around the underside of a dielectric window. A high density plasma can be generated in the reactor by supplying RF energy from an RF source to an external RF antenna such as a planar or non-planar coil having one or more turns outside the dielectric window on top of the reactor. The plasma generating source can be part of a modular mounting arrangement removably mounted in a vacuum tight manner on the upper end of the reactor.

A wafer can be supported within the reactor on a substrate support such as a cantilever chuck arrangement removably supported by a modular mounting arrangement from a sidewall of the reactor. Such a substrate support is at one end of a support arm mounted in a cantilever fashion such that the entire substrate support/support arm assembly can be removed from the reactor by passing the assembly through an opening in the sidewall of the reactor. The substrate support can include a chucking apparatus such as an electrostatic chuck and the substrate can be surrounded by a dielectric focus ring. The chuck can include an RF biasing electrode for applying an RF bias to the substrate during an etching process. The etching gas supplied by a gas supply can flow through channels between the window and an underlying gas distribution plate and enter the interior of the chamber through gas outlets in the gas distribution plate. The reactor can also include a heated liner extending from the gas distribution plate.

Alternatively, etching gas can be supplied by a multi-zone gas injector mounted in the dielectric window as disclosed in commonly assigned U.S. Patent Publication No. 2003/0070620 A1, the disclosure of which is hereby incorporated by reference in its entirety. FIGS. 1a-b show multi-zone gas injectors including on-axis injection outlet 124 to supply process gas to a central region to which process gas is supplied in an axial direction perpendicular to the substrate surface and an off-axis injection outlet 126 to supply process gas to a peripheral region to which process gas is supplied in an angled direction which is not perpendicular to the substrate. To control the gas flow in each line, flow controllers such as variable flow-restriction devices 136a, 736b can be placed in each of the separate gas lines that supply the different injection zones. The devices 136a, 136b can be set manually or operated automatically by suitable electronic controls. By independently varying the settings of the flow-restriction devices 136a, 136b the ratio of flows through the two outlets 124, 126 can be varied. Alternative implementations include multiple outlets and variable flow-restriction valves and/or networks of fixed restrictors and valves, which would enable the total conductance to each injection zone to be adjusted to one or more preset dynamically controlled values.

In FIG. 1a, the center gas injection outlet 124 is shown as a continuation of central bore 125. For example, the upper end of the bore 125 can be sealed by a window 127 arranged to communicate with monitoring equipment 129 such as a lamp, spectrometer, optical fiber and lens arrangement as disclosed in U.S. Pat. No. 6,052,176, the disclosure of which is hereby incorporated by reference in its entirety. In such an arrangement, the on-axis outlet 124 preferably has a larger diameter than the off-axis outlets 126. In FIG. 1b, the on-axis outlet 124 has a smaller diameter than the bore 125. The relative sizes of the on-axis outlet 124 and off-axis outlets 126 can be selected to achieve a desired gas flow distribution. For example, the total cross-sectional area of the off-axis outlets 126 can be less than, equal to, or greater than the total cross-sectional area of the on-axis outlet 124.

It will be apparent to those skilled in the art that the flow rates of the various gases will depend on factors such as the type of plasma reactor, the power settings, the vacuum pressure in the reactor, the dissociation rate for the plasma source, etc.

The reactor pressure is preferably maintained at a level suitable for sustaining a plasma in the reactor. In general, too low a reactor pressure can lead to plasma extinguishment whereas in a high density etch reactor too high a reactor pressure can lead to the etch stop problem. For high density plasma reactors, the reactor is preferably at a pressure below 100 mTorr. Typical process regimes for producing a high density plasma in a TCP™ reactor include about 450 W power, 60 V RF bias, pressure of 5 to 70 mT, and gas flow rates of 50-1000 sccm. Due to plasma confinement at the semiconductor substrate undergoing etching, the vacuum pressure at the substrate surface may be higher than the vacuum pressure setting for the reactor.

The substrate support supporting the semiconductor substrate undergoing etching preferably cools the substrate enough to prevent deleterious side reactions such as burning of any photoresist on the substrate and formation of undesirable reactant gas radicals. In high density plasma reactors, it is sufficient to circulate a fluid in the substrate support to maintain a substrate temperature of −10 to +80° C. The substrate support can include a bottom electrode for supplying an RF bias to the substrate during processing thereof and an ESC for clamping the substrate. For example, the substrate can comprise a silicon wafer which is electrostatically clamped and temperature controlled by supplying helium (He) at a desired pressure between the wafer and top surface of the ESC. In order to maintain the wafer at a desired temperature, the He can be maintained at a pressure of 2 to 30 Torr in the space between the wafer and the chuck.

Particular gas chemistries may be supplied at the periphery of a substrate by injecting the gas through a dielectric window at the top of the reactor, through a sidewall, for example near the dielectric window, through a chuck, or through an outer radius of a substrate holder. In particular, with reference to FIG. 2, which shows an embodiment of a plasma chamber useful for edge gas injection, particular gas chemistries may be supplied through a sidewall of a plasma chamber by injector 20 and flow along streamlines 21, while other gas chemistries may be supplied through the ceiling of a plasma chamber by showerhead nozzle 23 and flow along streamlines 24. While various examples of gas injection apparatus for supplying more of a particular gas chemistry at the periphery of a substrate have been described above, any suitable gas supply arrangement capable of supplying more silicon containing gas at the substrate periphery than in the center of the substrate can be used for the etch process described with reference to FIGS. 3 and 4.

FIG. 3 is a schematic showing a radial concentration profile of $SiCl_x$ in a plasma etch chamber, wherein a silicon layer on a semiconductor substrate is etched with plasma formed from $Cl_2$. $SiCl_x$ concentration due to etch reactions 310 peak over the semiconductor substrate 320 and reactor center 330. As the radius increases, the concentration of $SiCl_x$ species decreases due to pumpout 340 of $SiCl_x$ species and loss of $SiCl_x$ species to chamber wall 350 deposition reactions.

FIG. 4 is a schematic showing a radial concentration profile of $SiCl_x$ in a plasma etch chamber, wherein a silicon layer on a semiconductor substrate is etched with plasma formed from $Cl_2$ and silicon containing gas is supplied to a peripheral region of the plasma etch chamber. Similar to FIG. 3, $SiCl_x$ concentration due to etch reactions 410 peak over the semiconductor substrate 420 and reactor center 430, and as the radius increases, the concentration of $SiCl_x$ species decreases due to pumpout 440 of $SiCl_x$ species and loss of $SiCl_x$ species to chamber wall 450 deposition reactions. However, $SiCl_x$ concentration due to supply of silicon containing gas to a peripheral region of the plasma etch chamber 460 significantly reduces the radial variation in total $SiCl_x$ concentration 470.

Without wishing to be bound by any theory, it is believed that a reduction in radial variation in total $SiCl_x$ concentration improves the uniformity in the flux of passivating species to the semiconductor substrate, thereby improving radial critical dimension uniformity of the etch process. More generally, a passivating species comprising silicon passivates sidewalls of etched features. This passivating species comprising silicon may result from the plasma etching (i.e., come from the semiconductor substrate) and/or may be the silicon containing gas in the second gas. Preferably, the etch gas contains chlorine, such as, for example, when plasma is formed from $Cl_2$, and $SiCl_x$ passivates sidewalls of etched features.

While various embodiments have been described, it is to be understood that variations and modifications may be resorted to as will be apparent to those skilled in the art. Such variations and modifications are to be considered within the purview and scope of the claims appended hereto.

What is claimed is:

1. A method of etching a semiconductor substrate with improved critical dimension uniformity comprising:
    supporting a semiconductor substrate on a substrate support in an inductively coupled plasma etch chamber;
    supplying a first etch gas comprising a silicon containing gas to a central region over the semiconductor substrate;
    supplying a second gas comprising at least one silicon containing gas to a peripheral region over the semiconductor substrate surrounding the central region, wherein a concentration of silicon in the second gas is greater than a concentration of silicon in the first etch gas;
    adjusting an amount of silicon in the first etch gas relative to an amount of silicon in the second gas;
    generating a plasma from the first etch gas and second gas by inductively coupling radio frequency energy into the chamber; and
    plasma etching an exposed surface of the semiconductor substrate with the plasma;
    at least one passivating species comprising silicon passivates sidewalls of features etched into the semiconductor substrate; and
    the first etch gas comprises chlorine and the passivating species comprising silicon comprises $SiCl_x$, wherein x is 1, 2, 3 or 4.

2. The method of claim 1, comprising plasma etching a feature selected from the group consisting of at least one opening, via, trench, and gate structure in the exposed surface of the semiconductor substrate.

3. The method of claim 1, wherein the passivating species comprising silicon results from the plasma etching and from the second gas.

4. The method of claim 1, wherein the passivating species comprising silicon is provided by the silicon containing gas.

5. The method of claim 1, wherein the silicon containing gas is selected from the group consisting of $SiCl_4$, $SiHCl_3$, $SiH_2Cl_2$, $SiH_3Cl$ and mixtures thereof.

6. The method of claim 1, wherein the second gas further comprises an inert carrier gas.

7. The method of claim 6, wherein the inert carrier gas is selected from the group consisting of He, Ne, Ar, Kr, Xe, and mixtures thereof.

8. The method of claim 1, wherein the second gas further comprises an etchant gas.

9. The method of claim 8, wherein the etchant gas is selected from the group consisting of $Cl_2$, HBr, CF, $CF_2$, $CF_3$, $CH_2F_2$, $SF_6$, HCl, and mixtures thereof.

10. The method of claim 1, wherein the second gas further comprises a passivation gas.

11. The method of claim 10, wherein the passivation gas is selected from the group consisting of $O_2$, $N_2$, and mixtures thereof.

12. The method of claim 1, wherein plasma is generated by inductively coupling radio frequency energy into the plasma chamber by supplying radio frequency energy to a planar coil arranged parallel to the semiconductor substrate.

13. The method of claim 2, wherein a feature etched near a center of the semiconductor substrate is substantially uniform with an equivalent feature etched closer to an edge of the wafer.

14. The method of claim 13, wherein the semiconductor substrate is a 300 mm wafer and the features are less than 50 nm and have less than or equal to 1.5 nm 3σ non-uniformity.

15. A method of etching a semiconductor substrate with improved critical dimension uniformity comprising:
    supporting a semiconductor substrate on a substrate support in an inductively coupled plasma etch chamber;
    supplying a first etch gas comprising a silicon containing gas to a central region over the semiconductor substrate;
    supplying a second gas comprising at least one silicon containing gas to a peripheral region over the semiconductor substrate surrounding the central region, wherein a concentration of silicon in the second gas is greater than a concentration of silicon in the first etch gas;
    adjusting an amount of silicon in the first etch gas relative to an amount of silicon in the second gas;
    generating a plasma from the first etch gas and second gas by inductively coupling radio frequency energy into the chamber; and
    plasma etching an exposed surface of the semiconductor substrate with the plasma;
    wherein the exposed surface of the semiconductor substrate comprises a silicon layer; and
    the silicon layer comprises an exposed region of a single crystal silicon wafer, an exposed region of a strained silicon layer or a silicon germanium layer.

16. The method of claim 15, wherein the silicon layer is beneath a silicon nitride, silicon oxide, or silicon oxynitride, mask layer.

17. The method of claim 15, wherein the silicon layer is between an underlying gate oxide and an overlying hard or soft mask layer or photoresist.

18. The method of claim 17, wherein the silicon layer is beneath a silicon nitride, silicon oxide, or silicon oxynitride mask layer or photoresist.

19. A method of etching a semiconductor substrate with improved critical dimension uniformity comprising:
  supporting a semiconductor substrate on a substrate support in an inductively coupled plasma etch chamber;
  supplying a first etch gas comprising a silicon containing gas to a central region over the semiconductor substrate;
  supplying a second gas comprising at least one silicon containing gas to a peripheral region over the semiconductor substrate surrounding the central region, wherein a concentration of silicon in the second gas is greater than a concentration of silicon in the first etch gas;
  adjusting an amount of silicon in the first etch gas relative to an amount of silicon in the second gas;
  generating a plasma from the first etch gas and second gas by inductively coupling radio frequency energy into the chamber; and
  plasma etching an exposed surface of the semiconductor substrate with the plasma;
  wherein the second gas comprises a mixture of (i) $SiCl_4$, (ii) $C_xF_y$ or $C_xF_yH_z$ and (iii) an inert gas.

* * * * *